United States Patent [19]

Reitwiesner

[11] Patent Number: 5,485,363
[45] Date of Patent: Jan. 16, 1996

[54] WARM-UP TIME DELAY SYSTEM FOR RELAY CONTROLLED ELECTRICAL POWER SUPPLY

[76] Inventor: John S. Reitwiesner, 3619 Castle Ter., Silver Spring, Md. 20904

[21] Appl. No.: 81,749

[22] Filed: Jun. 25, 1993

[51] Int. Cl.⁶ .............................. H02H 5/04; F04B 49/00
[52] U.S. Cl. .................... 363/56; 361/28; 417/12
[58] Field of Search ................................. 363/50, 55, 56; 361/18, 28, 30, 59, 67, 75, 83, 89, 94; 417/12, 14; 340/660, 661, 664

[56] References Cited

U.S. PATENT DOCUMENTS

| | | | |
|---|---|---|---|
| 4,021,700 | 5/1977 | Ellis-Anwyl | 361/28 |
| 4,281,358 | 7/1981 | Plouffe et al. | 361/22 |
| 4,502,084 | 2/1985 | Hannett | 361/23 |
| 4,990,057 | 2/1991 | Rollins | 417/12 |
| 5,444,592 | 8/1995 | Shimizu et al. | 363/56 |

*Primary Examiner*—Matthew V. Nguyen

[57] ABSTRACT

The status of a power supply is monitored to control operation of on-time and off-time counters respectively producing a power restart time count and measuring the duration of power interruptions. The restart time is computed as a function of the measured duration of the power interruptions by programmed time delay control and comparator components operative through a latch circuit to control relay operation of a power output circuit through which operation of electronic equipment is regulated to safely accommodate power disturbances with minimum shutdown time.

3 Claims, 5 Drawing Sheets

WARM-UP TIME DELAY SYSTEM FOR RELAY CONTROLLED ELECTRICAL POWER SUPPLY

BACKGROUND OF THE INVENTION

This invention relates generally to the supply of electrical power to electronic equipment and more particularly to the protection of such equipment from the effects of power disturbances of a transient or temporary nature.

Electrical power interruptions often occur as a result of power plant operations or as a consequence of equipment malfunction or damage. In order to avoid damage to equipment and/or ensure safe operation of certain equipment, it is necessary to provide a waiting period after restoration of power of a duration in excess of some critical interval of time to prevent immediate supply of relatively high operating voltage to the equipment. For example, in certain radar control circuits a low voltage must be initially supplied to the transmitter tube filaments during a warm-up waiting period before high operating voltage is applied. Otherwise, the application of a high voltage to an electron tube for radar operation while the tube heater filaments are cold, may cause catastrophic failure. Thus, time delay relays have been utilized to ensure equipment stabilization by preheating or cooling sensitive components of the equipment during the same fixed waiting period, such as five minutes, before the high voltage is applied. The fixed waiting period often accounts for equipment shutdown with extended loss of its capability, despite very short or momentary power interruptions, because the duration of such waiting period is preset to assure safe operation under worst scenario conditions.

It is therefore an important object of the present invention to vary the time delay waiting interval before a high operating voltage is applied to electronic equipment so to accommodate different power disturbances without excessive equipment shutdown.

SUMMARY OF THE INVENTION

In accordance with the present invention, a time delay relay system is provided for powered electrical equipment to establish a variable waiting period that is proportional to the duration of power interruption. Existing time delay relay arrangements are accordingly replaced, to allow restart of equipment operation in the shortest allowable time following momentary loss of power, by use of counters to respectively measure power-off time and power-on time so as to establish a warm-up waiting period for power restart that is a computed function of the measured power off-time period. If power interruptions occur during the waiting period, the restart time is optionally recomputed based on the sum of such individual periods of power loss.

BRIEF DESCRIPTION OF THE DRAWING FIGURES

Other objects, advantages and novel features of the invention will become apparent from the following detailed description of the invention when considered in conjunction with the accompanying drawing wherein:

FIG. 3 is a circuit diagram of the power supply component of the system depicted in FIG. 2.

DETAILED DESCRIPTION OF PREFERRED EMBODIMENT

Figure 1:
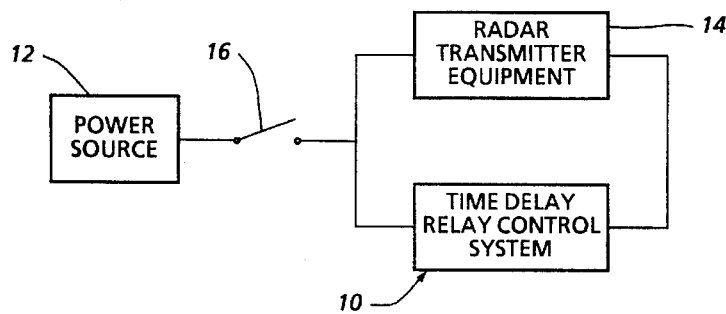
FIG. 1 is a schematic block diagram of a typical installation of the relay control system of the present invention.

Referring now to the drawing in detail, FIG. 1 diagrams a typical installation for a relay control system 10 of the present invention through which electrical power from a power source 12 is supplied to equipment 14, such as a radar transmitter, upon closing of a power switch 16. As diagramed in FIG. 2, equipment 14 includes a relay operated power output circuit 14a while the power source 12 upon closing of switch 16 is connected to a system power supply 17. Electrical dc voltage in thereby applied to a power input line 18 connected to relay components 20 and 22 of the circuit 14a as shown in FIG. 3.

With continued reference to FIG. 3, the output circuit 14a includes a DC powered device 24 and/or an ac powered device 26 respectively coupled to the power supply 17 through relays 20 and 22 which are simultaneously rendered operative by an enabling signal in a reset line 28 connected to the control base of a transistor 30 having a grounded emitter and output collector coupled to the enabling terminals of the relay components 20 and 22. The enabling signal in line 28 is supplied to the relays 20 and 22 to which input power line 18 is connected in order to control the supply of voltage to the output devices 24 and 26 of the output circuit 14a.

Figure 2:
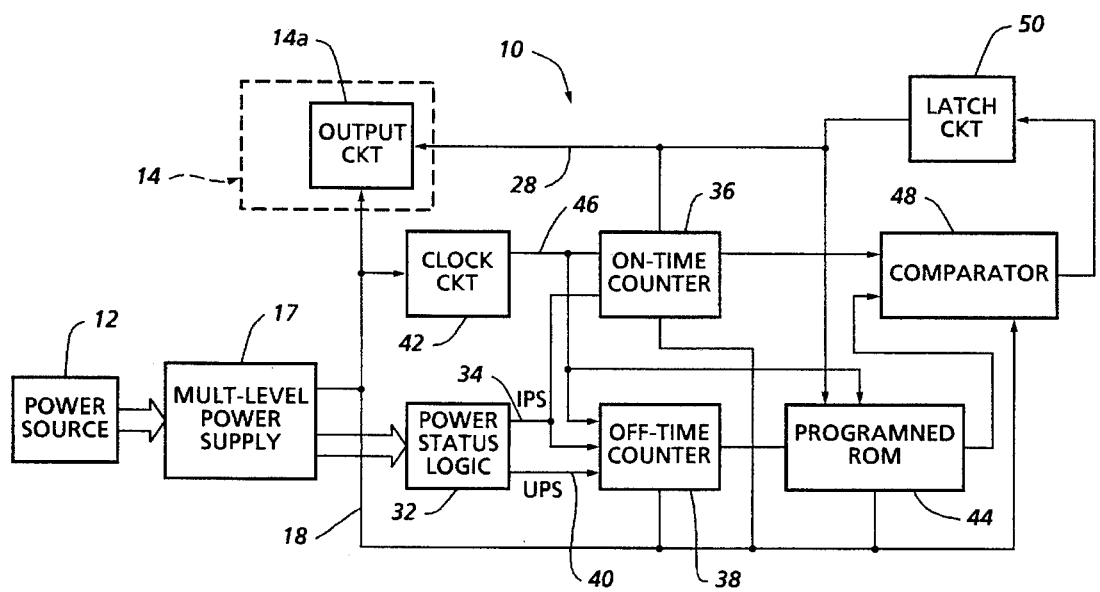
FIG. 2 is a block diagram functionally depicting the arrangement of components of the relay control system.

With reference to FIG. 2, the power supply 17 is monitored by power status logic 32 from which an interrupted power service line 34 extends to time measuring means including a clock circuit 42, on-time counter 36 and off-time counter 38. Also, an uninterrupted power service line 40 extends from the power status logic 32 to the off-time counter 38. The counters 36 and 38 and clock circuit 42 are powered through the input power line 18 which also powers a read only memory (ROM) 44 programmed for restart time delay control of the off-time counter 38 in accordance with a continuous timing pulse output of the clock circuit 42 connected thereto through clock signal line 46. The output of on-time counter 36 is compared with the output of off time counter 38 under programmed control of memory component 44 by means of a comparator 48 in order to control operation of a latch circuit 50 from which the reset line 28 extends for feedback to the counter 36 and for control of the supply of input power to the output circuit 14a as aforementioned.

The power source 12 supplies voltages at one energy level within a 24–55 dc volt range or a 24–140 ac volt range for example, to the power supply 17 within which it is rectified by diodes 54 and 56, as shown in FIG. 3 for supply of dc voltage. Such rectification of the power supply results in the dc voltage being applied directly through resistor 58 and dc voltage line 52 to the power status logic 32 while ac voltages from power source 12 are applied through transformer 60 to a full wave rectifier 62 connected between line 52 and the common ground line 64 to which the power status logic 32 is also connected. A dc voltage reduced by resistor 66 below that in line 52 is supplied from the junction between diodes 68 and 70 to a voltage regulator 72 from which the lower dc voltage is fed through diode 74 and line 76 to the power status logic 32. The lower regulated dc voltage is also fed through diode 78 to the input power line 18, through which the counters 36 and 38, restart time-delay control 44, clock circuit 42 and comparator 48 are powered, as aforementioned. During any interruption in supply of voltage from the source 12, voltage is supplied for a limited period of time, such as 15 minutes, by discharge of capacitors 80 monitored by the power status logic 32 through line 81. Capacitor discharge is also supplied through diode 82 to the input power line 18 during power supply interruption. The capacitors 80 are charged during normal power supply from source 12 by the output of the voltage regulator 72 in series with resistor 84 and diode 86.

Figure 4:
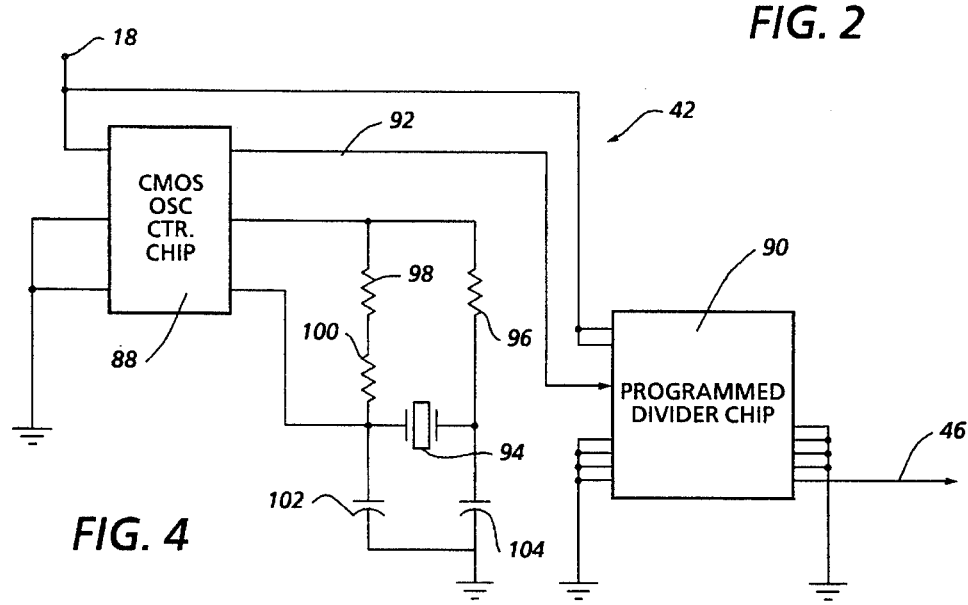
FIG. 4 is a circuit diagram of the clock circuit component shown in FIG. 2.

Referring now to FIG. 4, the clock circuit 42 includes a CMOS oscillator and counter chip 88 and a programmable divider chip 90 to which the input power line 18 is connected. A square wave output of chip 88, of a 1024 Hz frequency for example, is fed through line 92 to the chip 90 which is configured to divide the square wave input frequency by 8N, where N equals the number of seconds in a maximum interruption interval between 1 and 15 minutes. The input frequency of the square wave output of the chip 88 in line 92, is determined by a 32,768 Hz crystal 94 connected in series with resistor 96 and in parallel with resisters 98 and 100 across terminals of chip 88, one of which is grounded through capacitors 102 and 104. The divided clock signal output from divider chip 90 is fed by clock signal line 46 to the counters 36 and 38 and the time-delay control memory 44 as aforementioned.

Figure 5:
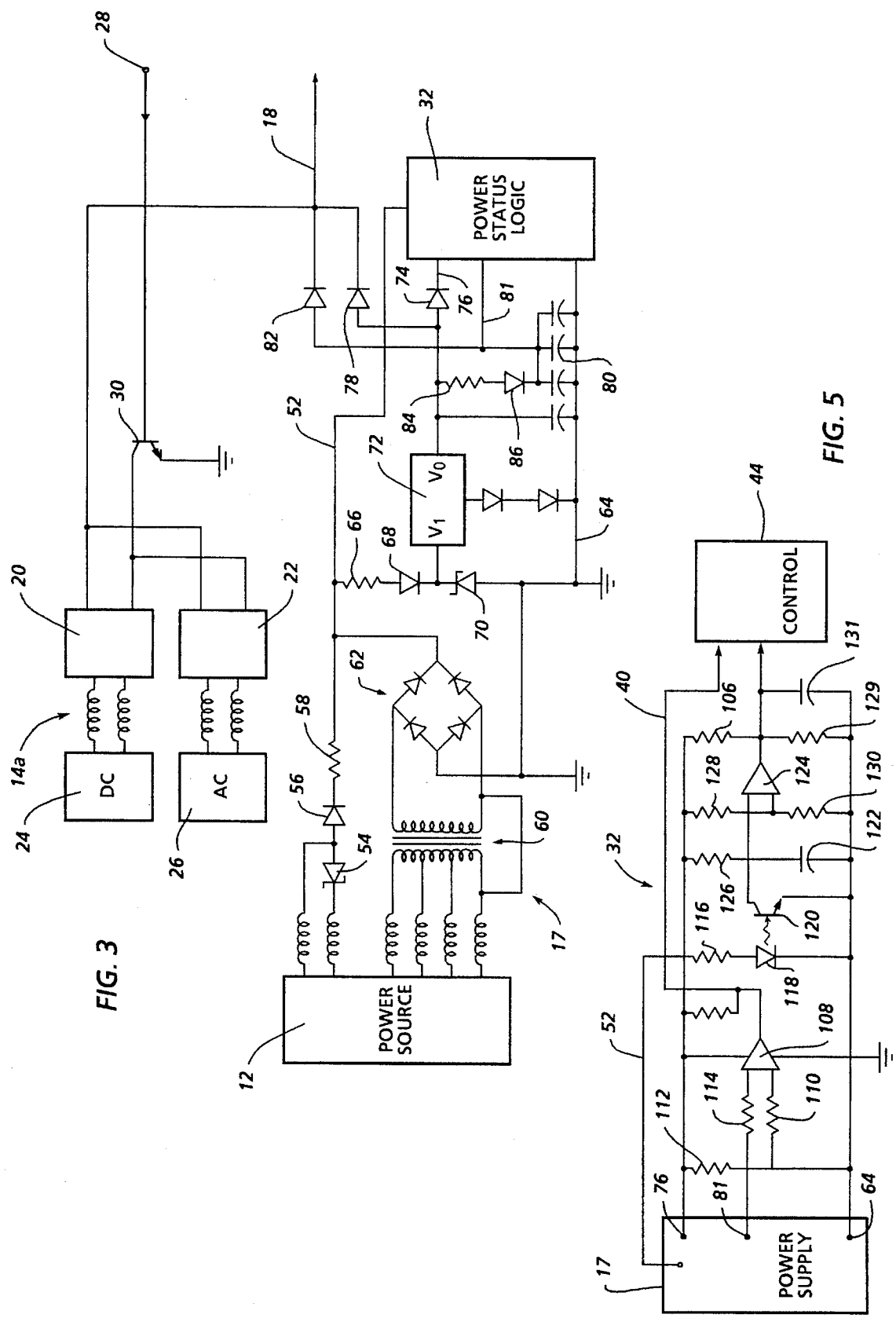
FIG. 5 is a circuit diagram of the power status logic component shown in FIG. 2.

FIG. 5 diagrams the circuitry of the power status logic 32 to which dc voltage in line 52 is normally fed from the power supply 17 while regulated dc voltage is received therefrom through the supply line 76. The power supply line 76 is accordingly connected through resistor 106 to the interrupted power service line 34 extending from the power status logic 32. The uninterrupted service line 40, on the other hand, is connected to the output of comparator 108 having one input coupled by resistors 110 and 112 to the regulated voltage supply line 76 and another input coupled by resistor 114 to the storage capacitor discharge line 81 of the power supply 17 from which ground line 64 extends to the junction between resistors 110 and 112.

Interruption of voltage supplied by the power status logic 32 to the counters through service line 34 is controlled by the supply of dc current in line 52 from the power supply 17. As shown in FIG. 5, line 52 is connected by resistor 116 to a light-emitting diode (LED) 118 operative through switching transistor 120 to ground capacitor 122 and one of the inputs of comparator 124 to which the regulated voltage is applied through line 76 in series with resistor 126. Accordingly, during normal supply of voltage from the power source 12 to the power supply 17, dc current is conducted by line 52 through resistor 116 to the grounded LED 118. The transistor 120 is thereby switched on for grounding of the capacitor 122 and one of the inputs of comparator 124. At the same time, a reduced voltage is applied to the other input terminal of comparator 124 from the junction between voltage reducing resistors 128 and 130 connected in series across dc voltage line 76 and ground 64. An output voltage of comparator 124 will then be applied through service line 34 to the time delay control 44 at a level regulated by the resistor 129 and capacitor 131 connected in parallel between line 34 and ground line 64. During a power failure, the voltage from power source 12 drops so that operation of LED 118 is interrupted to switch off transistor 120. Voltage is then applied to one input of comparator 124 by the discharge of capacitor 122 at a level determined by the charge accumulated therein through resistor 126 from the regulated voltage line 76. The output of comparator 124 in line 34 is thereby interrupted in response to any significant change in the voltage supply from source 12 reflecting a power failure.

Figure 6:
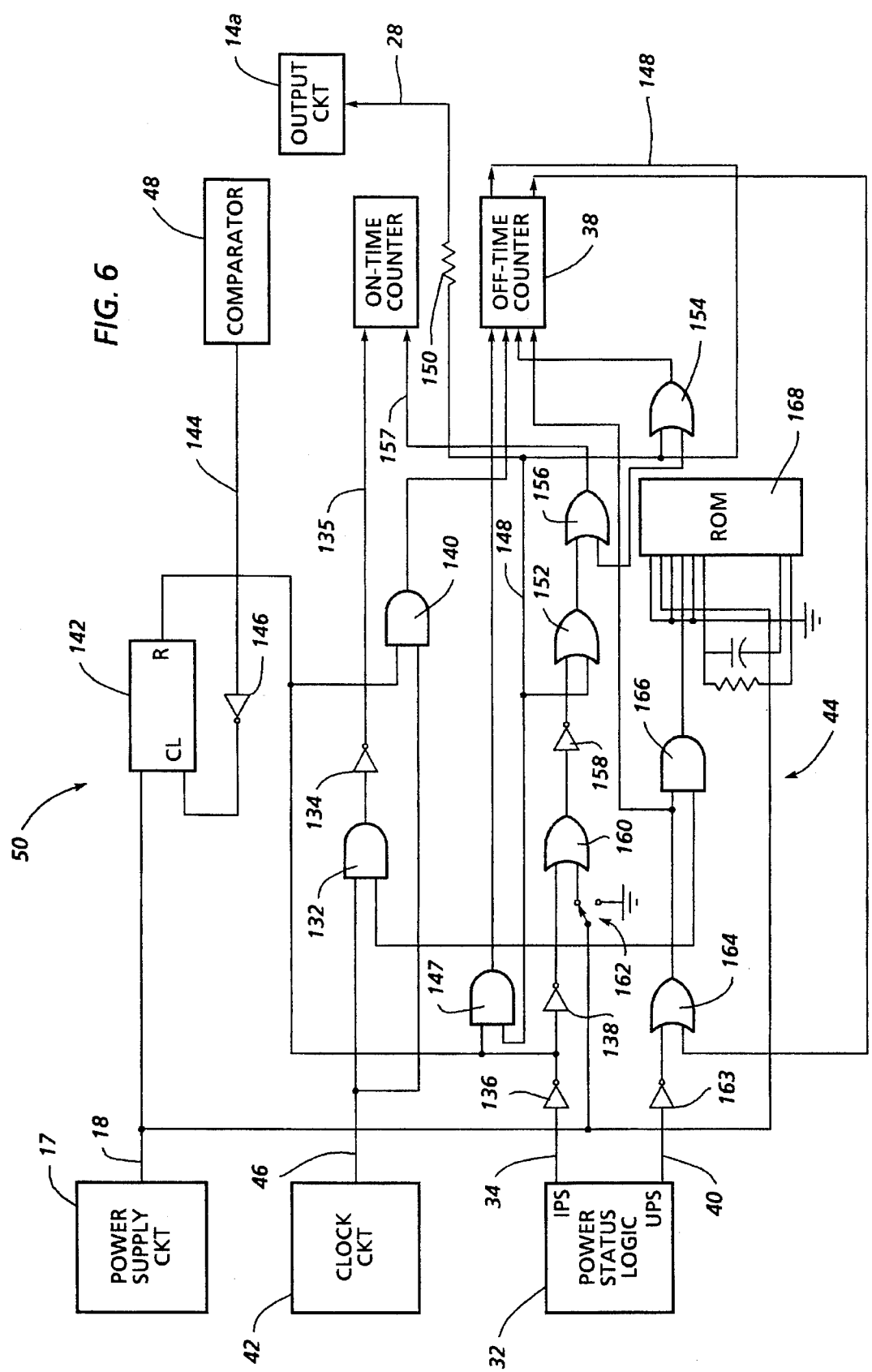
FIG. 6 is a circuit diagram featuring the programmed time delay control component shown in FIG. 2.

Referring now to FIG. 6, the 1 Khz divided clock signal output of clock circuit 42 in line 46 is fed to one input of AND gate 132 connected by inverter 134 to on-time counter 36 through memory disable line 135. Transmission of the divided clock signal applied to one input of said AND gate 132 is controlled by the voltage applied through interrupted power service line 34 and series connected inverters 136 and 138 to the other input of AND gate 132. The divided clock signal in line 46 is also fed to off-time counter 38 through AND gate 140 having one input thereof connected to the clock line 46. The other input of AND gate 140 is connected to the R input of the latch chip 142 of circuit 50, having a clock terminal to which the output line 144 from comparator 48 is connected through inverter 146. The latch circuit 50 is powered through the input power supply line 18 connected to the chip 142. The on-time counter 36 accordingly performs its timed pulse counting function during normal power supply under control of the time delay control 44 memory as diagrammed in FIG. 5.

Interrupted power signals are fed through inverter 136 and OR gate 147 to off-time counter 38. The output of counter 38 in enableline 148 is connected through resistor 150 and reset line 28 to the relays of the output circuit 14a as hereinbefore described. Enable line 148 from the off-time counter 38 is also connected to the respective inputs of OR gate 147 and NOR gates 152 and 154. The output of NOR gate 152 is connected to one input of NOR gate 156. The output of NOR gate 156 is connected to on-time counter 36 through memory enable line 157 while the output of NOR gate 154 is applied to the off-time counter 38 as shown in FIG. 6. The other input of NOR gate 152 is connected through inverter 158 to the output of NOR gate 160 having a power input selectively connected through a credit option switch 162 to the input power supply line 18. Displacement of switch 162 to its other open position disables the NOR gates 160, 152 and 156 to reset the on-time counter 36.

The uninterrupted power service line 40 from the power status logic 32 as shown in FIG. 5, is connected through inverter 163 to one input of NOR gate 164 having its other input connected to the off-time counter 38. The output of NOR gate 164 is connected to one input of AND gate 166 and the off-time counter 38. The other inputs of AND gate 132 and 166 are connected to the service line 34 through inverters 136 and 138 in order to control signal supply from AND gate 166 to read only memory (ROM) 168 from which the output is connected to inputs of the aforementioned NOR gates 154 and 156 for programmed operation of the time-delay control memory 44.

Figure 7:
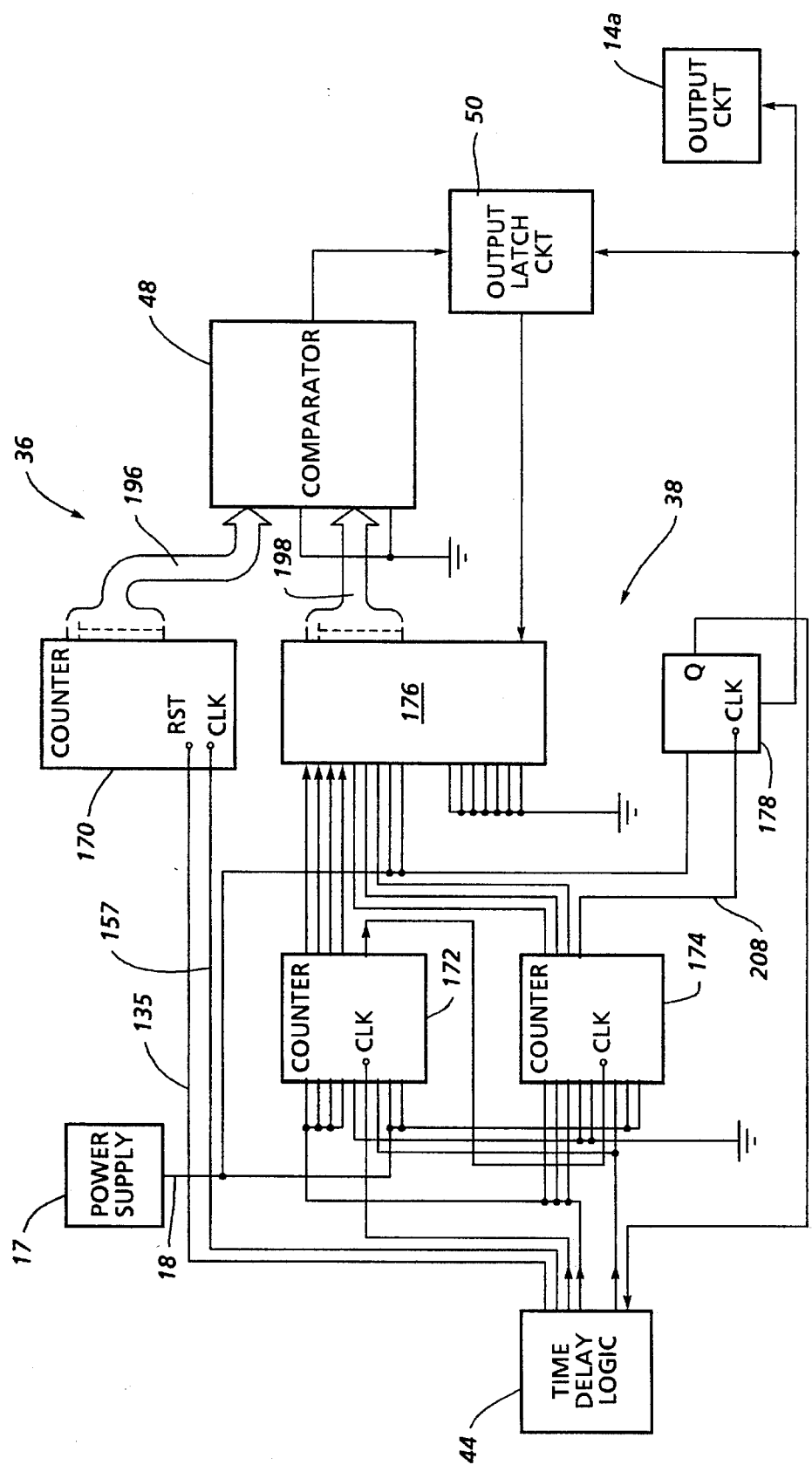
FIG. 7 is a circuit diagram featuring the counters depicted in FIG. 2.

FIG. 7 depicts in greater detail the arrangement of counters 36 and 38 in the system 10 diagrammed in FIGS. 2–6. The on-time counter 36 consists of a counter chip 170 having reset and clock terminals to which memory disable and enable signals are respectively applied by lines 135 and 157 from the time delay control memory 44 as hereinbefore described. The off-time counter 38, on the other hand, includes a counter chip 172 having a clock terminal to which the AND gate 140 of the time delay control memory 44 is connected. One output of the counter chip 172 is connected to the clock terminal of another counter chip 174 in the off-time counter 38 with the four other outputs thereof being connected to a memory chip 176 as diagrammed in FIG. 7. Three outputs of counter chip 174 are also connected to memory chip 176, while a fourth output of counter chip 174 is connected to the clock terminal of an overflow circuit chip 178 in the off-time counter 38 to which the output latch circuit 50 is connected through reset line 28 as shown. The Q output of overflow circuit chip 178 of the off-time counter 38 is connected to an input of NOR gate 164 in the time delay control memory 44 as hereinbefore described. Two additional outputs from the NOR gates 154 and 164 of the control memory 44 are connected in parallel to input terminals of the two counter chips 172 and 174 of the off-time counter 38 as shown in FIG. 7.

While the system 10 hereinbefore described is in its normal state, the output circuit 14a is enabled and maintained high by latch circuit 50, while the counters 36 and 38 are maintained reset at zero by power in line 18 from the power supply 17 and the time delay control memory 44. In such normal power status as denoted by block 180 in the functional block diagram of FIG. 8, the outputs in line 34 and 40 from the power status logic 32 are high. When the first power interruption occurs as indicated by block 182 in FIG. 8, the interrupted power service line 34 goes low to unlatch the output circuit 14a through latch 50 as functionally denoted by block 84, while input energy capacitively stored in the power supply 17 is fed through uninterrupted power service line 40 to the off-time counter 38 for a predetermined period of time, such as 15 minutes, to begin its count operation as denoted by block 186 and to disable ROM 168 in order to conserve power. The on-time counter 36 during such power interruption remains reset at zero as long as the switch 162 is not in its credit option selection position. The duration of the power interruption is accordingly measured by the pulse counting operation of the off-time counter 38. Also, with the output circuit 14a unlatched, it is allowed to disable.

Figure 8:
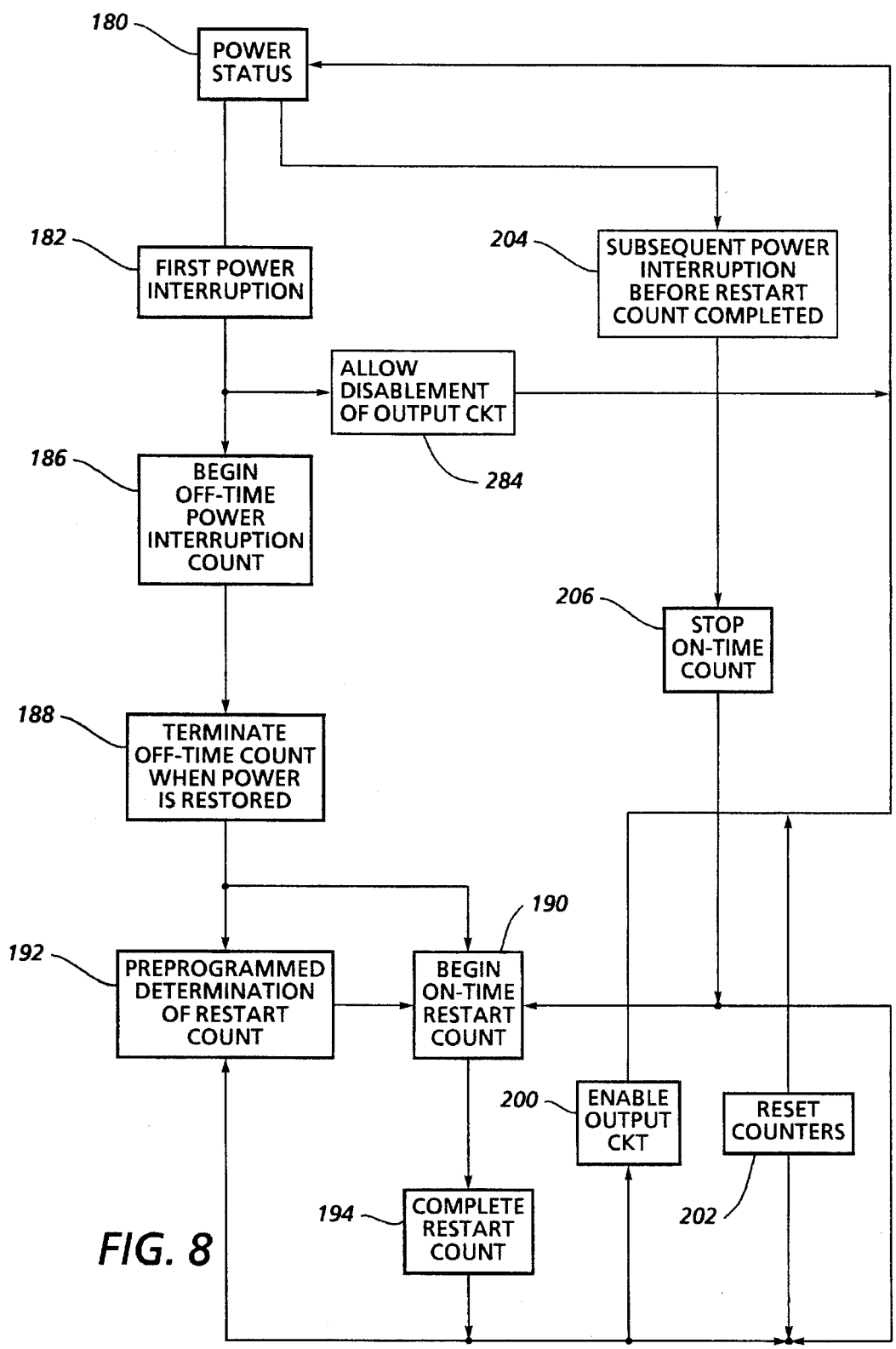
FIG. 8 is a functional diagram illustrating the operational program associated with the system depicted in FIGS. 2–7.

When power is restored, the counting operation of the off-time counter 38 is terminated, by the interrupted power service line 34 going high, as denoted by functional block 188 in FIG. 8. At the same time the counter chip 170 of the on-time counter 36 is enabled to begin a restart time count operation as denoted by block 190. The restart count is determined by the power interruption count from the off-time counter 38 as denoted by block 192 hereinafter explained in detail.

When the on-time counter 36 completes the restart count as denoted by block 194 in FIG. 8, the comparator 48 will operate the output latch circuit 50 as a result of receiving the restart output 196 from the memory chip 170 of the on-time counter 36 and the interruption count output 198 from the memory chip 176 of the off-time counter 38 as depicted in FIG. 7. Line 28 from the output latch circuit 50 is thereby caused to go high and enable the output circuit 14a as denoted by block 200 in FIG. 8 while the counters 36 and 38 are reset as denoted by block 202 accompanied by disablement of the memory chip 176 in the off-time counter 38 to conserve power if no further power interruption occurs before completion of the restart count.

If another power interruption occurs before the restart count is completed as denoted by block 204 in FIG. 8, the power service line 34 goes low to stop the on-time counter 36 through line 135 as denoted by block 206. With the output latch circuit 50 on high, the on-time counter 36 is stopped and reset to zero and the off-time counter 38 is restarted. The operational cycle hereinbefore described beginning with the power interruption step denoted by block 186, is then repeated. Such operation continues until the power status 180 is restored to normal, enabling the output circuit 14a.

With reference to FIG. 7, when the duration of power interruption exceeds a maximum interruption time count, to which off-time counter 38 is set, the overflow circuit 178 is latched by a clock output in line 208 from the counter chip 174 of the off-time counter 38, derived from the clock circuit 42 through the time delay control 44 as hereinbefore described. The clock signal in line 92 of the CMOS oscillator and counter 88 of the clock circuit 42, as shown in FIG. 4, is fed to its divider 90 configured to divide the frequency of the clock signal by 8N. A number of seconds (N) in the maximum interruption time between 1 and 15 minutes, for example, may thereby be selected for the clock circuit, so set by configuration of its divider 90 provided with inputs representing binary coded BCD digits as decimal point locations in the number of seconds (N) in the selected maximum interruption time.

As hereinbefore indicated, the restart count of the on-time counter 36 is determined from measurements of power interruption time by the off-time counter 38 preprogrammed through selection of the appropriate jumpers in its counter chips 172 and 174 in accordance with a lookup table. By use of such lookup table, complete flexibility is achieved by preprogrammed computation of restart time as a function of power interrupt time. Thus, if additional power interruptions occur before the output circuit 14a is enabled following a first power interruption, the restart time is recomputed based on the sum of all of the power interruption time periods. As another option, the restart time may be shortened during programmed computation by subtracting the previous power on-time period from the restart time.

According to certain embodiments of the invention, the range of maximum restart times reflecting the delay interval is between 1 second and 15 minutes to provide better than 2% resolution of the maximum restart time, where the lookup table has 128 entries according to one embodiment of the invention. The range of input voltage is from 24 volts to 55 volts dc and from 24 volts to 140 volts ac. The system then uses 0.120 amperes and no more than 16.8 watts of power. The output circuit 14a is also rated for 0.3 amperes at 200 volts ac or dc and is isolated from the input.

The system 10 as hereinbefore described may be tailored to a specific application by selecting appropriate jumpers, determining the maximum restart time, and creating a restart time versus interruption time function. This function can be converted into the 128-point lookup table aforementioned. The lookup table is programmed into the off-time counter chips 172, 174 and 176 while the maximum restart time is hard wired so that no adjustment to the output circuit 14a is then necessary. A copy of the referred look-up table pursuant to one specific embodiment of the invention is as follows:

| \multicolumn{8}{c}{LINEAR "LOOK-UP" TABLE FOR 5 MINUTE TIME SETTING} |
| Interrupt Time (Sec) | Restart Time (Sec) | Interrupt Time (Sec) | Restart Time (Sec) | Interrupt Time (Sec) | Restart Time (Sec) | Interrupt Time (Sec) | Restart Time (Sec) |
| --- | --- | --- | --- | --- | --- | --- | --- |
| 0.00 | 0.00 | 75.52 | 75.52 | 151.04 | 151.04 | 226.56 | 226.56 |
| 2.36 | 2.36 | 77.88 | 77.88 | 153.40 | 153.40 | 228.92 | 228.92 |
| 4.72 | 4.72 | 80.24 | 80.24 | 155.76 | 155.76 | 231.28 | 231.28 |
| 7.08 | 7.08 | 82.60 | 82.60 | 158.12 | 158.12 | 233.64 | 233.64 |
| 9.44 | 9.44 | 84.96 | 84.96 | 160.48 | 160.48 | 236.00 | 236.00 |
| 11.80 | 11.80 | 87.32 | 87.32 | 162.84 | 162.84 | 238.36 | 238.36 |
| 14.16 | 14.16 | 89.68 | 89.68 | 165.20 | 165.20 | 240.72 | 240.72 |
| 16.52 | 16.52 | 92.04 | 92.04 | 167.56 | 167.56 | 243.08 | 243.08 |
| 18.88 | 18.88 | 94.40 | 94.40 | 169.92 | 169.92 | 245.44 | 245.44 |
| 21.24 | 21.24 | 96.76 | 96.76 | 172.28 | 172.28 | 247.80 | 247.80 |
| 23.60 | 23.60 | 99.12 | 99.12 | 174.64 | 174.64 | 250.16 | 250.16 |
| 25.96 | 25.96 | 101.48 | 101.48 | 177.00 | 177.00 | 252.52 | 252.52 |
| 28.32 | 28.32 | 103.84 | 103.84 | 179.36 | 179.36 | 254.88 | 254.88 |
| 30.68 | 30.68 | 106.20 | 106.20 | 181.72 | 181.72 | 257.24 | 257.24 |
| 33.04 | 33.04 | 108.56 | 108.56 | 184.08 | 184.08 | 259.60 | 259.60 |
| 35.40 | 35.40 | 110.92 | 110.92 | 186.44 | 186.44 | 261.96 | 261.96 |
| 37.76 | 37.76 | 113.28 | 113.28 | 188.80 | 188.80 | 264.32 | 264.32 |
| 40.12 | 40.12 | 115.64 | 115.64 | 191.16 | 191.16 | 266.68 | 266.68 |
| 42.48 | 42.48 | 118.00 | 118.00 | 193.52 | 193.52 | 269.04 | 269.04 |
| 44.84 | 44.84 | 120.36 | 120.36 | 195.88 | 195.88 | 271.40 | 271.40 |
| 47.20 | 47.20 | 122.72 | 122.72 | 198.24 | 198.24 | 273.76 | 273.76 |
| 49.56 | 49.56 | 125.08 | 125.08 | 200.60 | 200.60 | 276.12 | 276.12 |
| 51.92 | 51.92 | 127.44 | 127.44 | 202.96 | 202.96 | 278.48 | 278.48 |
| 54.28 | 54.28 | 129.80 | 129.80 | 205.32 | 205.32 | 280.84 | 280.84 |
| 56.64 | 56.64 | 132.16 | 132.16 | 207.68 | 207.68 | 283.20 | 283.20 |
| 59.00 | 59.00 | 134.52 | 134.52 | 210.04 | 210.04 | 285.56 | 285.56 |
| 61.36 | 61.36 | 136.88 | 136.88 | 212.40 | 212.40 | 287.92 | 287.92 |
| 63.72 | 63.72 | 139.24 | 139.24 | 214.76 | 214.76 | 290.28 | 290.28 |
| 66.08 | 66.08 | 141.60 | 141.60 | 217.12 | 217.12 | 292.64 | 292.64 |
| 68.44 | 68.44 | 143.96 | 143.96 | 219.48 | 219.48 | 295.00 | 295.00 |
| 70.80 | 70.80 | 146.32 | 146.32 | 221.84 | 221.84 | 297.36 | 297.36 |
| 73.16 | 73.16 | 148.68 | 148.68 | 224.20 | 224.20 | 299.72 | 299.72 |

Numerous other modifications and variations of the present invention are possible in light of the foregoing teachings. It is therefore to be understood that within the scope of the appended claims the invention may be practiced otherwise than as specifically described.

What is claimed is:

1. In a system for preventing powered operation of equipment during a delay interval following interruptions in supply of power to the equipment, timing means for measuring duration of said interruptions in the supply of power, wherein said timing means includes clock means for continuously generating clock signals during the supply of power and during said interruptions thereof, on-time counter means connected to the clock means for producing a restart count of the clock signals in response to restoration of the supply of power and off-time counter means connected to the clock means during said interruptions for limiting the restart count to determine said delay interval and programmed logic means operatively connected to the timing means for varying said delay interval as a function of the duration of the interruptions measured by the timing means.

2. The system of claim 1 wherein said programmed logic means includes power status means connected to the timing means for rendering the on-time counter means operative to produce said restart count during said supply of power and comparator means connected to the on-time and off-time counter means for enabling said powered operation of the equipment in response to completion of the restart count.

3. The system of claim 1 wherein said programmed logic means includes power status means connected to the timing means for effecting measurement of the duration of the interruptions and establishment of the delay interval in response to restoration of the supply of power and restart control means connected to the timing means for enabling said powered operation of the equipment in response to elapse of the delay interval during the supply of power between the interruptions.

* * * * *